United States Patent
Xin et al.

(10) Patent No.: US 8,725,094 B2
(45) Date of Patent: May 13, 2014

(54) COMMUNICATION TERMINAL DEVICE AND CONTROL METHOD

(75) Inventors: Yang Xin, Shenzhen (CN); Ren-Wen Huang, Shenzhen (CN); Qiang You, Shenzhen (CN); Jun-Wei Zhang, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/433,296

(22) Filed: Mar. 29, 2012

(65) Prior Publication Data
US 2013/0252666 A1 Sep. 26, 2013

(30) Foreign Application Priority Data
Mar. 20, 2012 (CN) .......................... 2012 1 0074137

(51) Int. Cl.
*H04B 1/04* (2006.01)
(52) U.S. Cl.
USPC ..................................... 455/127.1; 455/343.1
(58) Field of Classification Search
USPC .................. 33/355 R; 713/300, 320, 324; 425/67.11, 115.1, 226.1, 343.1, 127.1, 425/63.1, 67.13
See application file for complete search history.

(56) References Cited

U.S. PATENT DOCUMENTS

| | | | | |
|---|---|---|---|---|
| 7,562,235 | B2 * | 7/2009 | Tseng et al. | 713/300 |
| 7,818,890 | B2 * | 10/2010 | Duric et al. | 33/355 R |
| 2009/0284225 | A1 * | 11/2009 | Nakanuma et al. | 320/134 |
| 2011/0117973 | A1 * | 5/2011 | Asrani et al. | 455/571 |

* cited by examiner

*Primary Examiner* — Sonny Trinh
(74) *Attorney, Agent, or Firm* — Novak Druce Connolly Bove + Quigg LLP

(57) ABSTRACT

A communication terminal device includes a magnetic sensor, a processor, and a power control module. The magnetic sensor detects a current magnetic field generated by induction of internal current in internal circuits of the communication terminal device, and provides a value of strength of the current magnetic field to the processor. The processor compares the value of the strength of the current magnetic field with preset values, and obtains a comparison result. In a situation that the processor determines that the current magnetic field is anomalous according to the comparison result, the processor controls the power control module to withhold power to the communication terminal device.

20 Claims, 2 Drawing Sheets

COMMUNICATION TERMINAL DEVICE AND CONTROL METHOD

BACKGROUND

1. Technical Field

The present disclosure relates to a communication terminal device and a control method for the communication terminal device.

2. Description of Related Art

A communication terminal device, such as a mobile phone, is very important for many people. Due to the improvement of manufacturing technology, thickness of the communication terminal device has become thinner then ever. Accordingly, a layout of a printed circuit board used in the communication terminal device becomes more and more complicated. When a large current flows through a conducting wire of the printed circuit board, it is possible to damage circuit components, especially essential components such as a central processing unit, thereby resulting a malfunction of the communication terminal device.

What is needed, therefore, is a communication terminal device which can overcome the described limitations.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION

Reference will be made to the drawings to describe the embodiments.

Figure 1:
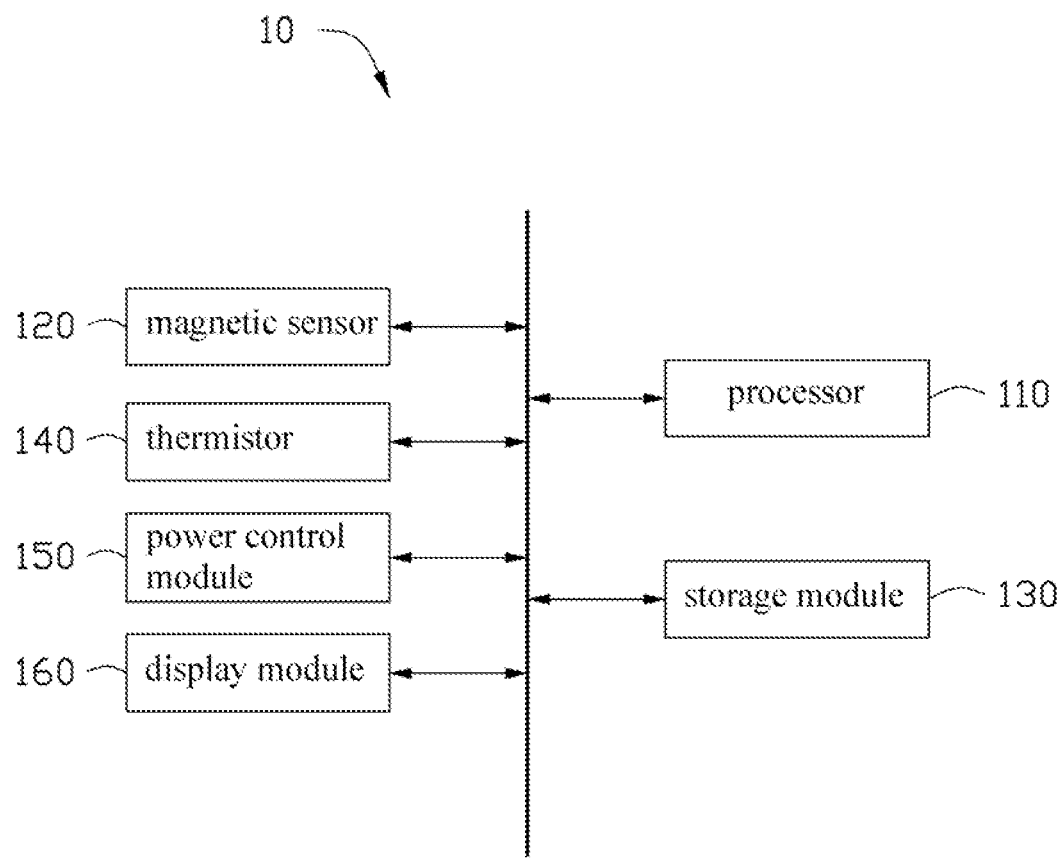
FIG. 1 is a schematic block diagram of a communication terminal device according to an exemplary embodiment.

FIG. 1 is a schematic block diagram of a communication terminal device 10 according to an embodiment. The communication terminal device 10 may be a mobile phone, for example. In this embodiment, the communication terminal device 10 includes a processor 110, a magnetic sensor 120, a storage module 130, a power control module 150, and a display module 160. The storage module 130 maybe a memory, and stores preset values of strengths of magnetic fields.

The magnetic sensor 120 may be an electronic compass, and detects a strength of a current magnetic field in the communication terminal device 10 and provides a value of the strength of the current magnetic field to the processor 110. The current magnetic field is generated by induction of internal current in internal circuits of the communication terminal device 10. The processor 110 compares the value of the strength of the current magnetic field with the preset values of the strength of magnetic field, and obtains a comparison result. When the processor 110 determines that the current magnetic field is anomalous according to the comparison result, the processor 110 is further configured to control the power control module 150 to withhold power to the communication terminal device 10, and activate an automatic shutdown function or an automatic restart function of the communication terminal device 10. The anomalous magnetic field is generally caused by a break of the internal current in the communication terminal device 10, and the break of internal current is liable to damage internal circuit components of the communication terminal device 10. Therefore, if the magnetic sensor 120 detects an anomalous magnetic field, the processor 110 provides a protection function by immediately withholding power to the communication terminal device 10.

In particular, the preset values of the strength of magnetic field include a first preset value and a second preset value. The first preset value denotes a critical value of the strength of an external interference magnetic field. The second preset value denotes a maximum value of the strength of magnetic field generated by the communication terminal device 10 functioning as normal. In this embodiment, the strength of the external interference magnetic field is greater than the strength of magnetic field generated by the communication terminal device 10 functioning as normal. Therefore, the first preset value is greater than the second preset value.

In operation, the magnetic sensor 120 detects a current magnetic field in the communication terminal device 10, and provides a value of strength of the current magnetic field to the processor 110. The processor 110 compares the value of the strength of the current magnetic field with the first preset value stored in the storage module 130. If the value of the strength of the current magnetic field is greater than the first preset value, the processor 110 determines that the current magnetic field is mainly induced by an external interference magnetic field. If the value of the strength of the current magnetic field is less than the first preset value, the processor 110 further compares the value of the strength of the current magnetic field with the second preset value stored in the storage module 130. If the value of the strength of the current magnetic field is less than the second preset value, the processor 110 determines that the current magnetic field is mainly induced by the communication terminal device 10 normally implementing its functions, such as communication function, photo function. If the value of the strength of the current magnetic field is greater than the second preset value and less than the first preset value, the processor 110 determines that the current magnetic field is anomalous and induced by a break of internal current in the communication terminal device 10. Then the processor 110 controls the power control module 150 to withhold power to the communication terminal device 10, and activates the automatic shutdown function or the automatic restart function.

In an alternative embodiment, when the processor 110 determines that the current magnetic field is anomalous, the processor 110 controls the display module 160 to display a prompt message to warn a user that internal malfunction may have been generated and prompt the user to turn the communication terminal device 10 off.

The communication terminal device 10 further includes a thermistor 140. When the processor 110 determines that the current magnetic field is anomalous, the processor 110 further determines whether an anomalous current flows through the thermistor 140. If the processor 110 determines that the thermistor 140 has an anomalous current, the processor 110 controls the power control module 150 to withhold power to the communication terminal device 10, and activates the automatic shutdown function or the automatic restart function. The anomalous current is defined to be out of a current range of the thermistor 140 when the communication terminal device 10 is functioning as normal.

Figure 2:
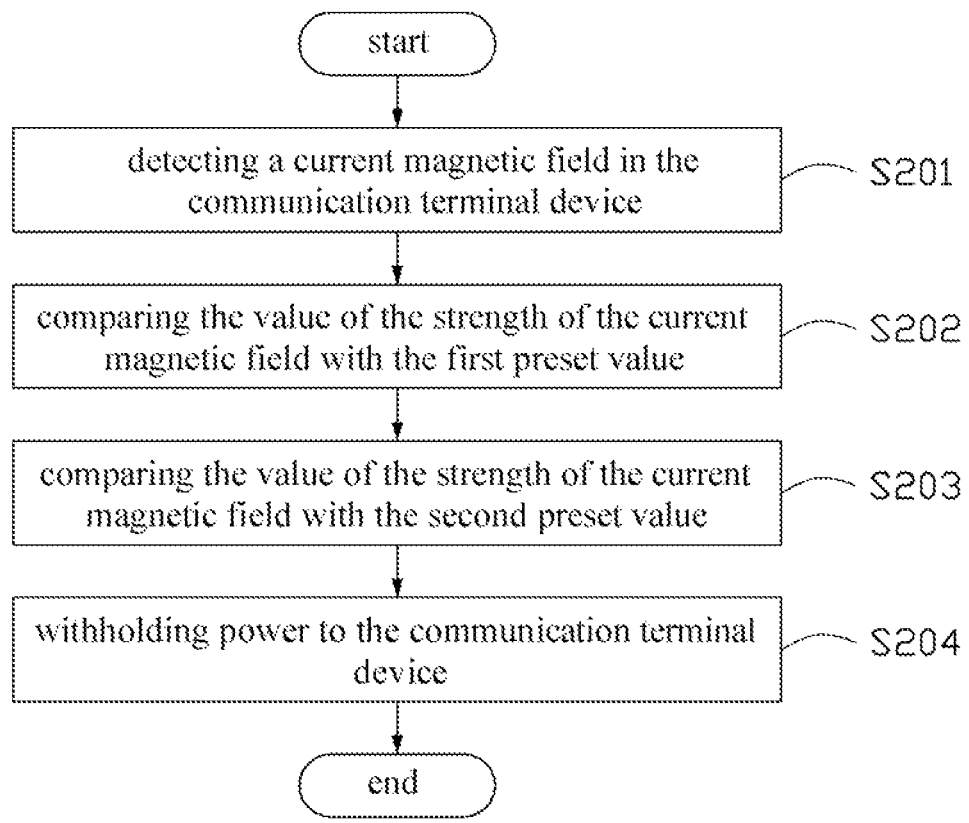
FIG. 2 is a schematic flowchart of a control method for the communication terminal device of FIG. 1 according to an exemplary embodiment.

FIG. 2 is schematic flowchart of a control method for the communication terminal device 10 according to one embodiment. The control method includes the following steps, but additional steps may be added, others deleted, and the ordering of the steps may be changed depending on the embodiment.

Step S201 is detecting a current magnetic field in the communication terminal device 10. In particular, the magnetic sensor 120 detects a current magnetic field in the communication terminal device 10, and provides a value of strength of the current magnetic field to the processor 110.

Step S202 is comparing the value of the strength of the current magnetic field with the first preset value. In the embodiment, the processor 110 reads the first preset value from the storage module 130, and compares the value of the strength of the current magnetic field with the first preset value. If the value of the strength of the current magnetic field is greater than the first preset value, the processor 110 determines that the current magnetic field is mainly induced by an external interference magnetic field, and step S201 is performed. If the value of the strength of the current magnetic field is less than the first preset value, step S203 is performed.

Step S203 is comparing the value of the strength of the current magnetic field with the second preset value. In particular, the processor 110 reads the second preset value from the storage module 130, and further compares the value of the strength of the current magnetic field with the second preset value. If the value of the strength of the current magnetic field is less than the second preset value, the processor 110 determines that the current magnetic field is mainly induced by the communication terminal device 10 normally implementing its functions, and step S201 is performed. If the value of the strength of the current magnetic field is greater than the second preset value and less than the first preset value, step S204 is performed.

Step S204 is withholding power to the communication terminal device 10. In particular, if the value of the strength of the current magnetic field is greater than the second preset value and less than the first preset value, the processor 110 determines that the current magnetic field is anomalous and induced by a break of internal current in the communication terminal device 10. Then, the processor 110 controls the power control module 150 to withhold power to the communication terminal device 10, and activates the automatic shutdown function or the automatic restart function.

In an alternative embodiment, when the processor 110 determines that the current magnetic field is anomalous, the processor 110 further determines whether an anomalous current flows through the thermistor 140. If the processor 110 determines that the thermistor 140 has an anomalous current flowing, the processor 110 controls the power control module 150 to withhold power to the communication terminal device 10, and activates the automatic shutdown function or the automatic restart function.

In another alternative embodiment, when the processor 110 determines that the current magnetic field is anomalous, the processor 110 first controls the display module 160 to display a prompt message to warn a user that internal malfunction may have been generated, and prompt the user to turn off the communication terminal device 10. At the same time, the processor 110 further determines whether an anomalous current flows through the thermistor 140. If the processor 110 determines that the thermistor 140 has an anomalous current, the processor 110 controls the power control module 150 to withhold power to the communication terminal device 10, and activates the automatic shutdown function or the automatic restart function.

In summary, the communication terminal device 10 and the control method can determine whether internal current of the communication terminal device 10 is normal by detecting the current magnetic field in the communication terminal device 10. When the current magnetic field is anomalous, the communication terminal device 10 activates the automatic shutdown function or the automatic restart function, and the internal components can be protected. Therefore, security and reliability of the communication terminal device 10 is improved.

It is believed that the present embodiments and their advantages will be understood from the foregoing description, and it will be apparent that various changes may be made thereto without departing from the spirit and scope of the embodiments or sacrificing all of their material advantages.

What is claimed is:

1. A communication terminal device, comprising:
a magnetic sensor configured to detect a strength of a current magnetic field generated by induction of internal current in internal circuits of the communication terminal device;
a processor configured to receive a value of the strength of the current magnetic field provided by the magnetic sensor, compare the value of the strength of the current magnetic field with preset values, and obtain a comparison result;
a storage module that stores the preset values; and
a power control module;
wherein in a situation that the processor determines that the current magnetic field is anomalous according to the comparison result, the processor is further configured to control the power control module to withhold power to the communication terminal device; wherein the preset values include a first preset value and a second preset value, the first preset value denotes a critical value of strength of an external interference magnetic field, and the second preset value denotes a maximum value of strength of magnetic field generated by the communication terminal device functioning as normal.

2. The communication terminal device of claim 1, wherein the first preset value is greater than the second preset value.

3. The communication terminal device of claim 1, wherein in a situation that the value of the strength of the current magnetic field is greater than the second preset value and less than the first preset value, the processor is configured to determine that the current magnetic field is anomalous.

4. The communication terminal device of claim 3, further comprising a thermistor, wherein in the situation that the processor determines that the current magnetic field is anomalous, the processor is further configured to determines whether an anomalous current flows through the thermistor, if the processor determines that the thermistor has an anomalous current flowed through, the processor controls the power control module to withhold power to the communication terminal device.

5. The communication terminal device of claim 3, further comprising a display module, wherein in the situation that the processor determines that the current magnetic field is anomalous, the processor is further configured to control the display module to display a prompt message to warn a user that internal malfunction has been generated.

6. The communication terminal device of claim 1, wherein the magnetic sensor is an electronic compass.

7. The communication terminal device of claim 1, wherein the processor further activates an automatic shutdown function or an automatic restart function of the communication terminal device in a situation that the processor determines that the current magnetic field is anomalous.

8. A control method for a communication terminal device, the communication terminal device comprising a magnetic sensor, a processor and a power control module, and the method comprising:

detecting a current magnetic field generated by induction of internal current in internal circuits of the communication terminal device by the magnetic sensor;

comparing a value of strength of the current magnetic field with preset values by the processor and obtaining a comparison result; and controlling the power control module to withhold power to the communication terminal device in a situation that the processor determines that the current magnetic field is anomalous according to the comparison result;

wherein preset values are stored in a storage module, and include a first preset value and a second preset value, the first preset value denoting a critical value of strength of an external interference magnetic field, the second preset value denoting a maximum value of strength of magnetic field generated by the communication terminal device functioning as normal.

9. The method of claim 8, wherein comparing the value of the strength of the current magnetic field with the preset values comprises comparing the value of the strength of the current magnetic field with the first preset value.

10. The method of claim 9, wherein comparing the value of the strength of the current magnetic field with the preset values further comprises comparing the value of the strength of the current magnetic field with the second preset value in a situation that the value of the strength of the current magnetic field is less than the first preset value.

11. The method of claim 10, wherein in a situation that the value of the strength of the current magnetic field is greater than the second preset value and less than the first preset value, the processor determines that the current magnetic field is anomalous.

12. The method of claim 11, further comprising determining whether anomalous current flows through a thermistor of the communication terminal device, wherein if the processor determines that the thermistor has an anomalous current flowed through, the processor controls the power control module to withhold power to the communication terminal device.

13. The method of claim 11, further comprising controlling a display module to display a prompt message to warn a user that internal malfunction has been generated, before controlling the power control module to withhold power to the communication terminal device.

14. The method of claim 8, wherein the first preset value is greater than the second preset value.

15. The method of claim 8, wherein the magnetic sensor is an electronic compass.

16. The method of claim 8, further comprising activating an automatic shutdown function or an automatic restart function of the communication terminal device in a situation that the processor determines that the current magnetic field is anomalous.

17. A communication terminal device, comprising:

a magnetic sensor detecting a strength of a current magnetic field generated by induction of internal current in internal circuits of the communication terminal device;

a storage module storing a first preset value and a second preset value less than the first preset value, the first preset value denoting a critical value of strength of an external interference magnetic field, and the second preset value denoting a maximum value of strength of magnetic field generated by the communication terminal device functioning as normal;

a power control module; and a processor receiving a value of the strength of the current magnetic field provided by the magnetic sensor and comparing the value of the strength of the current magnetic field with the first preset value and the second preset value, and the processor controlling the power control module to withhold power to the communication terminal device when the value of the strength of the current magnetic field is greater than the second preset value and less than the first preset value.

18. The communication terminal device of claim 17, further comprising a thermistor, wherein in the situation that the value of the strength of the current magnetic field is greater than the second preset value and less than the first preset value, the processor is further configured to determines whether an anomalous current flows through the thermistor, if the processor determines that the thermistor has an anomalous current flowed through, the processor controls the power control module to withhold power to the communication terminal device.

19. The communication terminal device of claim 17, further comprising a display module, wherein in the situation that the processor determines that the current magnetic field is anomalous, the processor is further configured to control the display module to display a prompt message to warn a user that internal malfunction have been generated.

20. The communication terminal device of claim 17, wherein the processor further activates an automatic shutdown function or an automatic restart function of the communication terminal device in a situation that the value of the strength of the current magnetic field is greater than the second preset value and less than the first preset value.

\* \* \* \* \*